US006930628B2

(12) United States Patent
Reinhold et al.

(10) Patent No.: US 6,930,628 B2
(45) Date of Patent: Aug. 16, 2005

(54) AMPLITUDE DETECTION FOR CONTROLLING THE DECISION INSTANT FOR SAMPLING AS A DATA FLOW

(75) Inventors: Mario Reinhold, Nuremberg (DE); Eduard Rose, Nuremberg (DE); Frank Kunz, Albrecht-Durer-Platz (DE)

(73) Assignee: CoreOptics, Inc., Nuremberg (DE)

( * ) Notice: Subject to any disclaimer, the term of this patent is extended or adjusted under 35 U.S.C. 154(b) by 0 days.

(21) Appl. No.: 10/138,672

(22) Filed: May 3, 2002

(65) Prior Publication Data

US 2002/0186159 A1 Dec. 12, 2002

Related U.S. Application Data

(60) Provisional application No. 60/288,374, filed on May 3, 2001.

(51) Int. Cl.[7] .............................. H03M 1/12; H03D 3/24
(52) U.S. Cl. ...................................... 341/155; 375/376
(58) Field of Search ................................ 341/155, 139, 341/144; 330/149; 327/165, 156; 375/224, 226, 269, 355, 375, 376; 329/304; 331/1 A; 370/542

(56) References Cited

U.S. PATENT DOCUMENTS

| 3,619,503 | A | * | 11/1971 | Ragsdale | 375/269 |
| 3,900,823 | A | | 8/1975 | Sokal et al. | |
| 4,449,102 | A | * | 5/1984 | Frazer | 327/165 |
| 4,475,210 | A | * | 10/1984 | Couch | 375/224 |
| 5,251,238 | A | * | 10/1993 | Menk et al. | 375/355 |
| 5,828,328 | A | | 10/1998 | Marks | |
| 5,991,346 | A | * | 11/1999 | Lu | 375/355 |
| 6,347,128 | B1 | * | 2/2002 | Ransijn | 375/376 |
| 6,621,861 | B1 | * | 9/2003 | Shen | 375/226 |
| 6,643,346 | B1 | * | 11/2003 | Pedrotti et al. | 375/375 |

OTHER PUBLICATIONS

International Search Report for PCT/US02/14030, dated Oct. 21, 2002 (1 page).

J.J.D.H. Alexander, "Clock Recovery From Random Binary Signals", 11 Electronic Letters, pp. 541–542 (1975).

* cited by examiner

*Primary Examiner*—Patrick Wamsley
(74) *Attorney, Agent, or Firm*—Edwards & Angell, LLP; Howard M. Gitten

(57) ABSTRACT

A circuit for generating a digital data signal from an analog input data signal is disclosed. The circuit comprises a master-slave flip-flop with a clock input for receiving the analog input data signal, an amplitude detecting circuit for detecting the amplitude of the analog input data signal and generating an amplitude detection signal in response thereto, and a phase shifting circuit responsive to the amplitude detection signal for supplying a phase shifted signal to the clock input of the master-slave flip-flop. The circuit may further include a clock recovery circuit for generating a recovered clock signal from a clock signal contained in the analog input data signal. The recovered clock signal may be supplied to the amplitude detecting circuit, or a feedback loop may supply the phase shifted clock signal to the amplitude detecting circuit.

11 Claims, 6 Drawing Sheets

AMPLITUDE DETECTION FOR CONTROLLING THE DECISION INSTANT FOR SAMPLING AS A DATA FLOW

CROSS REFERENCE TO RELATED APPLICATIONS

Priority is claimed from provisional application Ser. No. 60/288,374, filed May 3, 2001.

FIELD OF THE INVENTION

This invention relates to data recovery circuits, and more particularly, to a circuit for recovering digital data from an analog input data signal.

BACKGROUND OF THE INVENTION

The Internet is fundamentally changing the face of networking. Network traffic grows greater and greater each year. Network providers need optical transport solutions that provide high volume channel count, capacity per channel, optical link distance, and sufficient physical space in order to carry the increased traffic.

Current state of the art networks provide 10 Gb/s (Gigabit per second) capacity per optical channel. However, this is not expected to provide sufficient bandwidth to carry projected traffic on the Internet. The next step is believed to be an increase to a 40 Gb/s per channel high-speed fiber-optic communication system.

In high-speed fiber-optic communication systems, Awhere digital data is transmitted in an analog input data signal, digital receiver performance is determined by the ability to detect the digital data in the analog input data signal and recover the clock signal contained therein. An eye diagram, a graphical representation of a signal with fluctuations in the amplitude on the vertical axis and time on the horizontal axis, provides a convenient way to understand the impact of amplitude fluctuations on the performance of a digital receiver. A typical eye diagram of an ideal analog input data signal is a flat curve (FIG. 1). Amplitude jitter strongly impacts the eye diagram of the analog input data signal, and a large amount of jitter changes the shape of the eye diagram significantly away from the ideal flat curve, making it difficult to recover the digital data contained in the analog input data signal (FIG. 2).

It is, of course, necessary to recover the digital data contained in the analog input data signal for the digital receiver to be useful. One prior art circuit for recovering digital data has employed a master-slave D-type flip-flop, which receives the analog input data signal and generates a digital zero or digital one at its output terminal, thereby recovering the digital data (FIG. 3). Such a prior art circuit recovers the data by sampling the analog input data signal at predetermined intervals. The phase difference between the master-slave D-type flip-flop clock signal and the input data signal determines the instant when the sampling occurs. Typically, this occurs in "mid-bit," that is, in the middle of the time period allowed for the transmission of the bit.

Known clock recovery circuits based on a binary type or Alexander type phase detector are considered to be self-aligned, i.e., the analog input data signal is sampled in the mid-bit position. The input swing or vertical eye opening at the sampling instant has a significant impact on the ability of the master-slave D-type flip-flop to recover digital data. If an ideal analog data signal is sampled in mid-bit position with the clock phase, the vertical eye opening is maximized, leading to optimized data recovery (FIG. 4). However, when the analog input data signal possesses significant amplitude jitter, mid-bit sampling frequently does not occur at the moment of maximized vertical eye opening, thus resulting in a degraded sample and faulty recognition of the digital data (FIG. 5). In such an instance, the moment of sampling may not be optimal for accurate recovery of the digital data.

SUMMARY OF THE INVENTION

In accord with the present invention, a circuit for generating a digital data signal from an analog input data signal comprises a master-slave flip-flop with a clock input for receiving the analog input data signal, an amplitude detecting circuit for detecting the amplitude of the analog input data signal and generating an amplitude detection signal in response thereto, and a phase shifting circuit responsive to the amplitude detection signal for supplying a phase shift signal to the clock input of the master-slave flip-flop. The circuit may further include a clock recovery circuit for generating a recovered clock signal from a clock signal contained in the analog input data signal, and supplying the recovered clock signal to the phase shifting circuit. In accordance with one embodiment of the invention the recovered clock signal may be supplied to the amplitude detecting circuit, or as in another embodiment of the invention the phase shift signal is output by the phase shifter to the amplitude detecting circuit as a feedback loop.

Also in accord with the present invention, a method of generating a digital data signal from an analog input data signal carried on a high-speed communications network comprises the steps of supplying the analog input data signal to a master-slave flip-flop, detecting the amplitude of the analog input data signal and generating an amplitude detection signal in response thereto, and supplying a phase shifted clock signal to the master-slave flip-flop in response to the amplitude detection signal by utilizing a phase shifter. The method may also include the steps of generating a recovered clock signal from the analog input data signal, and supplying the recovered clock signal to the amplitude detector.

Further in accord with the present invention, a circuit for generating a digital data signal from an analog input data signal carried on a high-speed communications network is provided. The circuit comprises a D-type master-slave flip-flop that receives the analog input data signal, and an amplitude detecting circuit that detects a maximum vertical eye opening in the analog input data signal and generates a maximum vertical eye opening signal in response thereto. The amplitude detecting circuit comprises a fixed phase shift circuit, a sample and hold circuit, a squaring and integrating circuit, and a low pass filter. A phase shifting circuit is responsive to the maximum vertical eye opening signal and supplies a phase shift signal to the master-slave D-type flip-flop and the amplitude detecting circuit. A clock recovery circuit generates a recovered clock signal from a clock signal contained in the analog input data signal. The clock recovery circuit comprises latch circuits that generate clock sample signals from the analog data input signal, a phase detector logic circuit that generates a phase detected signal in response to the clock sample signals, a phase-locked-loop filter that generates a control signal in response to the phase detected signal, and a voltage controlled oscillator that actuates the latch circuits and the phase shifting circuit in response to the control signal. A feedback loop supplies the phase shifted clock signal to the amplitude detecting circuit. A dithering circuit generates a dither signal, an adding circuit adds the dither signal to the maximum vertical eye opening signal, and a circuit supplies the summed signal to the phase shifting circuit.

Still further in accord with the present invention, a circuit for generating a digital data signal from an analog input data signal carried on a high-speed communications network is disclosed. The circuit comprises a D-type master-slave flip-flop that receives the analog input data signal, and an amplitude detecting circuit that detects the maximum vertical eye opening of the analog input data signal and generates a maximum vertical eye opening signal in response thereto. The amplitude detecting circuit comprises a sample and hold circuit, a squaring and integrating circuit, a signal processing circuit, and a frequency divider circuit. A phase shifting circuit is responsive to the maximum vertical eye opening signal and supplies a phase shift signal to the master-slave D-type flip-flop. A clock recovery circuit generates a recovered clock signal from a clock signal contained in the analog input data signal and comprises latch circuits that generate a plurality of clock sample signals from the analog data input signal, a phase detector logic circuit, a phase-locked-loop filter, and a voltage controlled oscillator.

DETAILED DESCRIPTION OF THE PREFERRED EMBODIMENTS

Figure 1:
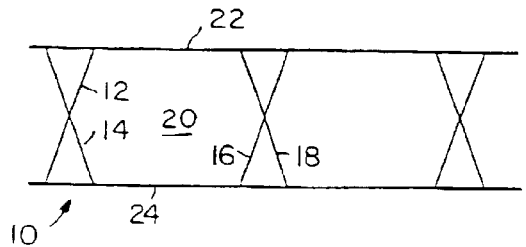
FIG. 1 is an eye diagram of an ideal analog input data signal.

Referring to the drawings, and initially to FIG. 1 thereof, there is shown an eye diagram of an ideal analog input data signal 10. The amplitude of the analog input data signal 10 is depicted on the vertical axis, while time is depicted on the horizontal axis. In the ideal analog input data signal 10 of FIG. 1, the transition pattern 011 (bits "011") is denoted by reference numeral 12. Transition pattern 100 (bits "1100") is denoted by reference number 14. Transition pattern 001 (bits "001") is denoted by reference numeral 16, while transition pattern 110 (bits "110") is denoted by reference numeral 18. The resulting eye is denoted by reference numeral 20. It is to be appreciated that the eye 20 is bounded by a relatively straight line 22 on the upper portion thereof and a relatively straight line 24 on the lower portion thereof.

Figure 2:
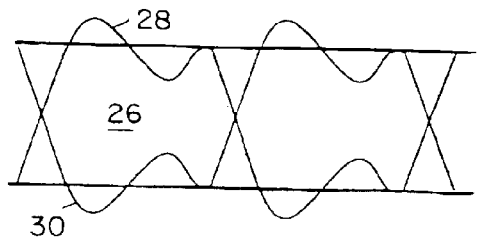
FIG. 2 is an eye diagram of a typical analog input data signal.

FIG. 2 illustrates a typical, real-world analog input data signal 10, which has substantial amplitude jitter. As is apparent from the Figure, the eye 26 is not ideal as in FIG. 1; rather, the eye 26 is bounded by an upper curve 28 and a lower curve 30, and not straight lines 22, 24.

Figure 3:
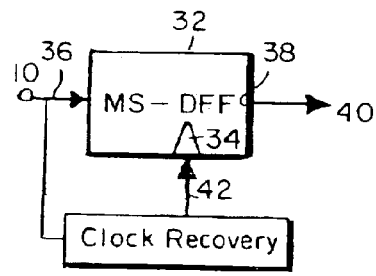
FIG. 3 is a schematic diagram of a prior art master-slave D-type flip-flop used to recover digital data from an analog input data signal.

Turning now to FIG. 3, a prior art master-slave D-type flip-flop 32 is shown having a clock input terminal 34, a signal input 36 for receiving the analog input data signal 10, and an output terminal 38 for outputting the recovered digital data 40. The master-slave D-type flip-flop 32 recovers the data from the analog input data signal 10 by sampling the analog information of the analog input data signal 10 at a predetermined instant or moment in time, and outputting a digital zero or digital one at the output terminal 38. The moment or instant that the sample is taken is determined by the phase difference between a clock signal 42 applied to the clock input terminal 34 of the master-slave D-type flip-flop 32 and the input data signal 10.

Figure 4:
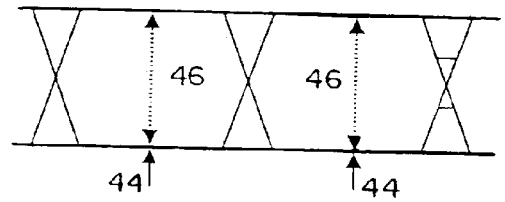
FIG. 4 is an eye diagram of an analog input data signal sampled at the mid-bit position, with a clock phase of $\phi_{mid-bit}$.

A prior art clock recovery circuit such as the one depicted in FIG. 3 is considered to be self-aligned, i.e., the analog input data signal 10 is sampled in mid-bit position 44 (see FIG. 4). The input swing or vertical eye opening 46 at the sampling instant 44 has a significant impact on the ability of the master-slave D-type flip-flop 32 to recover digital data 40 from the analog input data signal 10. If an ideal analog data signal 10 is sampled in mid-bit position 44 with the clock phase $\phi_{mid-bit}$, the vertical eye opening 46 is maximized, leading to optimized data recovery. However, when the analog input data signal 10 possesses significant amplitude jitter (see FIG. 5), mid-bit sampling 48 frequently does not occur at the moment of maximum vertical eye opening 50, thus resulting in a degraded sample and faulty recognition of the digital data in the analog input data signal 10. In such an instance, the moment of sampling is not optimal.

Figure 5:
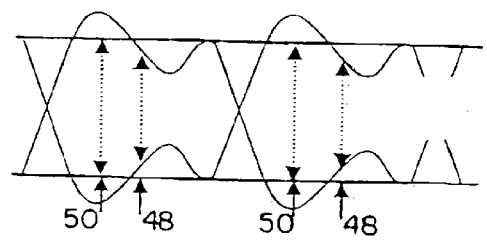
FIG. 5 is an eye diagram of an analog input data signal with significant amplitude jitter sampled at the mid-bit position and at optional sampling points.
Figure 6:
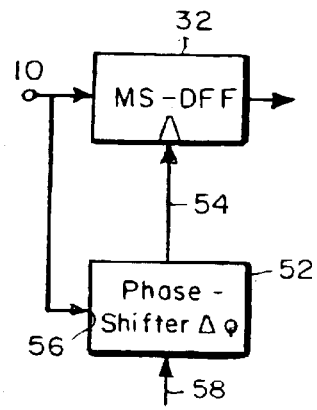
FIG. 6 is a schematic diagram of a prior art circuit where the sampling clock for the master-slave D-type flip-flop is manually adjusted.

In order to overcome the problem of the non-optimal sampling moment in the circuit of FIG. 5, it has been proposed to add a phase shifter 52 manually to shift the phase $\phi$ of the sampling clock signal 54 applied to the master-slave D-type flip-flop 32. As indicated in FIG. 6, the analog data input signal 10 is applied to a terminal 56, and thence, to the master-slave D-type flip-flop 32 and the phase shifter 52. The phase shifter 52 applies a fixed phase shift amount to the clock signal 58 and supplies the phase shifted signal 54 as the sampling clock signal of the master-slave D-type flip-flop 32. The sampling instant of the master-slave D-type flip-flop 32 is adjusted with regard to an optimal value $\phi_{optimal}$ where it samples at a maximum vertical eye opening.

The circuit of FIG. 6 has important shortcomings, however. First, the optimal phase $\phi_{optimal}$ must be adjusted manually. Second, the optimal phase $\phi_{optimal}$ varies dynamically depending on the shape of the eye diagram of the analog input data signal 10. That is, the position (or phase) of the point of maximum amplitude in the bit changes as the point of maximum vertical eye opening changes.

Figure 7:
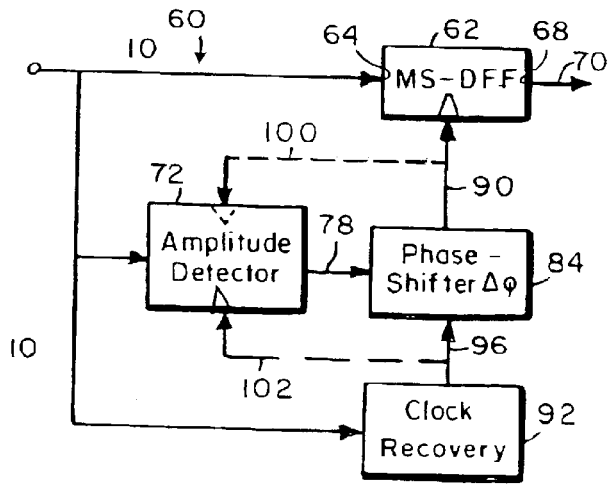
FIG. 7 is a schematic diagram of a circuit according to the present invention.

Referring now to FIG. 7, applicants propose a data recovery circuit 60 that overcomes the problems of the prior art circuit of FIG. 6 by automatically maximizing the decision capability with respect to the eye or shape of the analog input data signal 10. The circuit 60 comprises a master-slave D-type flip-flop 62. The master-slave D-type flip-flop 62 receives the analog input data signal 10 and the phase shifted signal form a phase shifter 84 to produce a recovered digital data 70. The data recovery circuit 60 also includes an amplitude detector 72 that receives the analog input data signal 10, and a clock input from either one of a clock recovery circuit 92 or a phase shifter 84 in a respective embodiment. It will be appreciated that master-slave flip flop 62 has only a single clock input, but is indicated in the Figure as having two, as shown in dotted line, for ease of presentation of different embodiments, as will be discussed more fully below.) The amplitude detector 72 outputs an amplitude detecting signal 78 to phase shifter 84. The phase shifter 84 supplies a phase shifted clock signal 90 to the clock input terminal 66 of the master-slave D-type flip-flop 62, as described more fully herein. The data recovery circuit 60 includes a clock recovery circuit 92 that receives the analog input data signal 10. The clock recovery circuit 92 recovers the clock signal in the analog input data signal 10 and supplies a recovered clock signal 96 to the phase shifter 84.

The optimal decision instant for sampling the analog input data signal 10 is correlated with the maximum vertical eye opening. Therefore, the data recovery circuit 60 of FIG. 7 controls or adjusts the phase of the phase shifted clock signal 90 applied at input terminal 66 of master-slave D-type-flip-flop 62 so that the instant of the maximum vertical eye opening 50 of FIG. 5 and the decision instant coincide. The amplitude detector 72 detects the moment when the maximum vertical eye opening 50 occurs and adjusts the phase shifter 84 so that the decision instant or moment of activation of the master-slave D-type flip-flop 62 coincides with the moment of maximum vertical eye opening 50.

The data recovery circuit 60 of FIG. 7 shows two alternative embodiments for adjusting the phase shifter 84 so that the decision instant of the master-slave D-type flip-flop 62 coincides with the instant of maximum vertical eye opening 50. In a first embodiment, indicated in FIG. 7 by the lightly dotted line 100, the amplitude detector 72 measures the eye shape and, during this process, controls the phase shifter 84. The amplitude detector 72, together with the phase shifter 84, form a feedback loop, since the phase-shifted clock signal 90 is fed back as the clock input of the amplitude detector 72.

In a second embodiment, the amplitude detector 72 measures the eye shape and afterwards adjusts the phase-shifter 84. This embodiment does not utilize a feedback loop. The recovered clock signal 96 is supplied to the amplitude detector 72 along a dotted line 102. In the second embodiment, the data recovery circuit 60 engages in an iterative process of sampling the analog input data signal 10 at predetermined intervals in order to identify the maximum vertical eye opening 50 (see FIG. 5).

Figure 8:
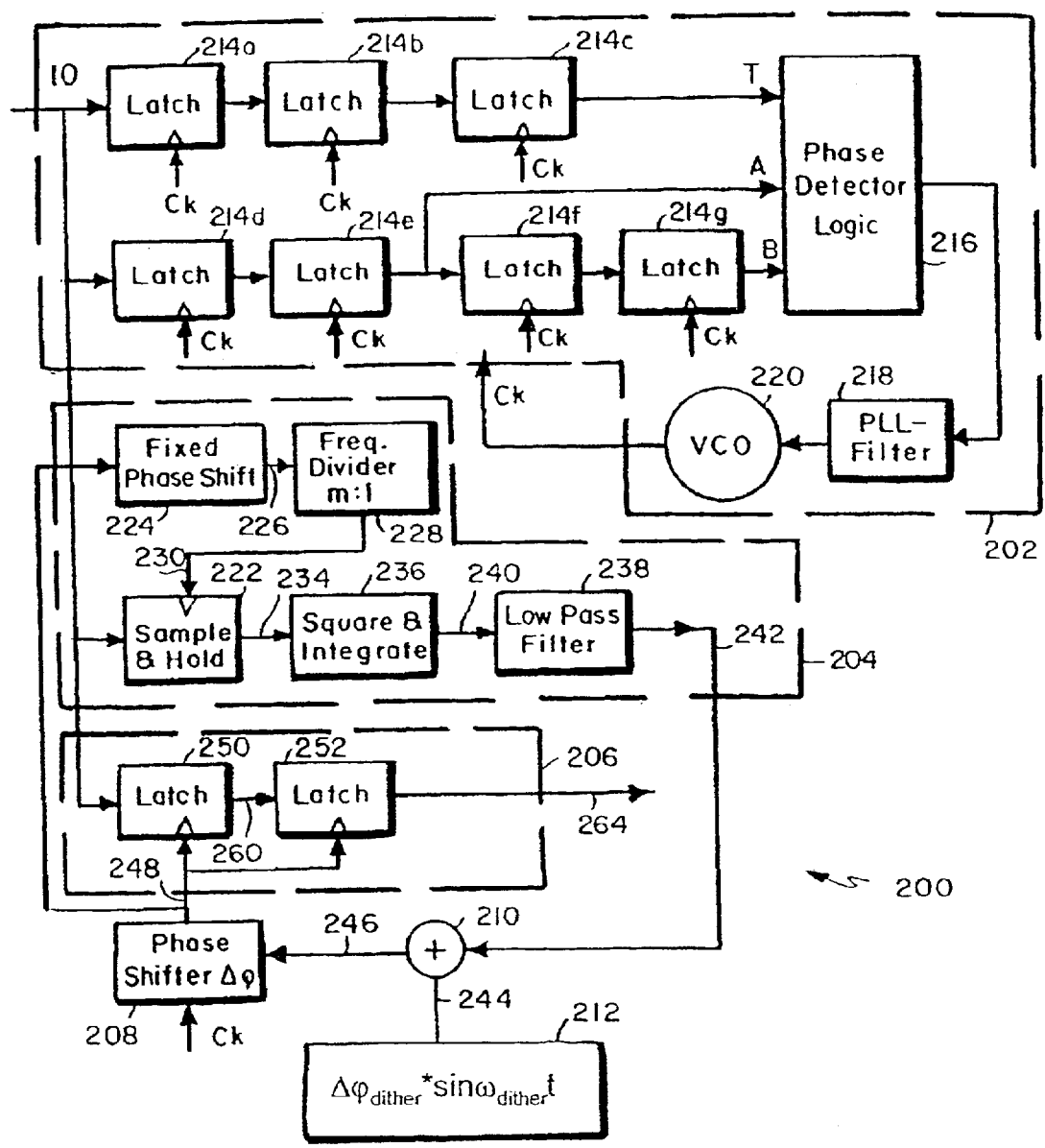
FIG. 8 is a detailed schematic diagram of an embodiment of a circuit according to the present invention.

Turning now to FIG. 8, a data recovery circuit 200 constructed in accordance with the first embodiment of the invention (utilizing a feedback loop) includes a clock recovery circuit 202, an amplitude detector 204, a master-slave D-type flip-flop 206, a phase shifter circuit 208, an adding circuit 210, and a dither signal generating circuit 212. Each circuit 202–212 will be discussed more fully below.

A preferred clock recovery circuit 202 includes an Alexander phase detector, as described in an article by J. J. D. H Alexander, *Clock Recovery from Random Binary Signals,* 11 ELECTRONIC LETTERS, 541–542, (1975), the disclosure of which is incorporated herein by reference. To summarize its construction and operation, the clock recovery circuit 202 includes a plurality of latch circuits 214a–214g that receives the analog input data signal 10 and generates three (3) sample signals A, B and T. The sample signal T is derived from the output signal of the latch circuits 214a–214c. The sample signal A is derived from the output signal of the latch circuits 214d–214e. The sample signal B is derived from the output signal of the latch circuits 214f–214g. The sample signals A, B, and T are supplied to a phase detector logic circuit 216. The phase detector logic circuit 216 supplies its output signal to a phase locked loop (PLL) filter circuit 218. The output signal of the PLL circuit 218 is supplied to control a voltage controlled oscillator (VCO) 220, which generates a recovered clock signal $C_k$. The recovered clock signal $C_k$ is aligned with respect to the middle of the digital bit contained in the analog input data signal 10.

The analog input data signal 10 is also supplied to a sample and hold circuit 222 in the amplitude detector 204. A phase shifted clock signal from the phase shifter circuit 208, as described more fully hereinbelow with reference to the phase shifter circuit 208, is supplied to a fixed phase shift circuit 224 in the amplitude detector 204. The fixed phase shift circuit 224 applies a fixed phase shift amount to the phase shifted clock signal, and then supplies the phase shifted signal 226 to a frequency divider circuit 228. The frequency divider circuit 228 divides the phase to shifted signal 226 by a predetermined amount, m, wherein m is an integer, and supplies the frequency divided signal 230 as a clock input of the sample and hold circuit 222. The frequency divider circuit 228 reduces the operational speed of the amplitude detector 204, and thereby relaxes the requirements of the sample and hold circuit 222. It is to be appreciated that the sample and hold circuit 222 contains the analog value of the analog input data signal 10 at a certain instant or moment in time.

The sample and hold circuit 222 generates an output signal 234 that is supplied to a squaring and integrating circuit 236. The squaring and integrating circuit 236 first squares the output signal 234 to assess the logical 0 and the logical 1 in the same way. The squared signal is integrated to generate a mean value signal 240 which is input to a low pass filter 238. The low pass filter 238 removes frequency components up to an amount $\omega_{dither}$, which will be explained more fully hereinbelow with reference to the dither signal generating circuit 212. The low pass filter 238 supplies an output signal 242 to the adding circuit 210.

The dither signal generating circuit 212 generates a dither signal 244 according to the equations:

$$\Delta\phi_{dither} * \sin \omega_{dither} t,$$

where, for example, $\omega_{dither} < 2\pi \, f_{clock}$ and $\Delta\phi_{dither} << 180°$. The dither signal 244 is supplied to the adding circuit 210, where it is added to the output signal 242 of the low pass filter 238. The dither signal 244 is added to the output signal 242 in order to dither the moment a sample is taken by the sample and hold circuit 222. Accordingly, the analog input data signal 10 is quasi differentiated by a difference quotient.

The adding circuit 210 supplies an amplitude modulated signal 246 to the phase shifter circuit 208. The phase shifter circuit 208 applies a fixed phase shift $\Delta\phi$ to the clock input to generate the phase shifted clock signal 248. $\Delta\phi_{dither}$ is related to amplitude modulated signal 246. The phase shifted clock signal 248 is supplied to the fixed phase shift circuit 224 of the amplitude detector 204, and to the master-slave D-type flip-flop 206.

The master-slave D-type flip-flop 206 comprises a pair of cascaded latches 250, 252 having respectively receiving phase shifted clock signal 248 as their clock signal. The latch 250 receives at its input terminal 258 the analog input data signal 10, and supplies an output signal 260 to the latch 252 in response to the phase shifted clock signal 248. The latch 252 supplies a recovered digital data signal 264.

It is to be appreciated that the fixed phase shift circuit 224 in the amplitude detector 204 compensates for possible phase-offsets between the sample and hold circuit 222 and the latch 250 with respect to the sampling instant of the analog input data signal 10.

It will be further appreciated that, as discussed hereinbefore with respect to the circuit of FIG. 7, a feedback loop, comprising the amplitude detector 204 and the phase shifter circuit 208, is closed by feeding the phase-shifted clock signal 248 back as the clock input of the sample and hold circuit 204.

Figure 9:
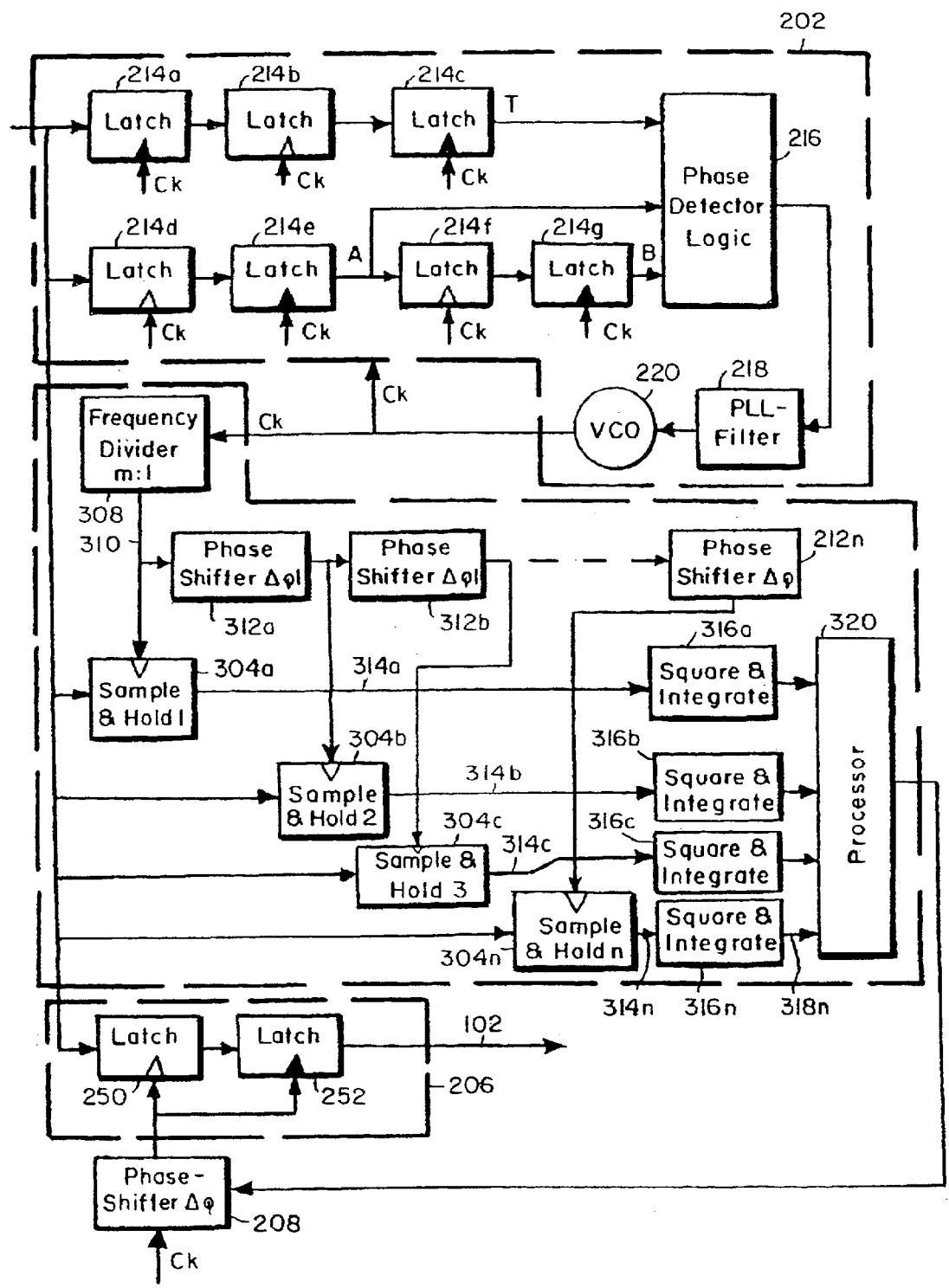
FIG. 9 is a detailed schematic diagram of a second embodiment of a circuit according to the present invention.

Turning now to FIG. 9, a second embodiment of a data recovery circuit 300 is disclosed. The data recovery circuit 300 is directed to the non feed back embodiment in which Amplitude detector 72 is controlled by an output of clock recovery circuit 92. Like numerals are utilized to indicate like structure, the primary difference being the construction of the amplitude detector. Specifically, data recovery circuit 300 includes the clock recovery circuit 202, the master-slave D-type flip-flop 206, and the phase shifter circuit 208, all the same as described hereinbefore with respect to the circuit of FIG. 8. However, it is to be noted that in the embodiment of FIG. 9, the recovered clock signal $C_k$ is supplied not only to the latches 214a–214g, but also to the amplitude detector circuit 302, as will be discussed more fully hereinbelow.

An amplitude detector circuit 302 comprises a plurality n of parallel sample and hold circuits 304a–304n. The recovered clock signal 302 $C_k$ is supplied to a frequency divider circuit 308, where the recovered clock signal is divided by an integer m to generate a trigger signal 310. The trigger signal 310 is supplied as a clock input to each of the sample and hold circuits 304a–304n. In addition, the trigger signal 310 is supplied to a plurality n of cascaded phase shifting circuits 312a–312n. Each phase shifting circuit 312a–312n applies a fixed phase shift $\Delta\phi_i$, where i=a . . . n, to the trigger signal 310, where $\Delta\phi_i = i^*\Delta\phi_i$ to output a respective phase sifted signal 311a–311n. Each sample and hold circuit 304a–n receives phase shifted trigger signal from phase shifter n–1, as a clock signal, sample and hold circuit 304 receiving a signal with no shift directly from frequency divider 308. The sample and hold circuits 304a–304n generate output signals 314a–314n that are supplied to a plurality n of squaring and integrating circuits 316a–316n. The squaring and integrating circuits 316a–316n operate in a fashion similar to the squaring and integrating circuit 236 of the circuit of FIG. 8, i.e., the circuits 316a–316n first square the output signals 314a–314n to assess the logical 0 and the logical 1 in the same way. The squared signals are then integrated to generate n mean value signals 318a–318n. Each mean value signal 318a–318n corresponds to the n different phases $\Delta\phi_i$ (a being a zero phase phase shift). The mean value signals 318a–318n are then supplied to an n-channel parallel processor circuit 320.

The n-channel parallel processor circuit 320 performs the following functions:

(1) compares the values of the signals of each of the n different channels to find the largest and the smallest value signals;
(2) identifies the smallest value signal as the bit transition;
(3) identifies the largest value signal as the instant of maximum vertical eye opening; and
(4) supplies a control signal 322 to the phase shifter circuit 208 at the instant corresponding to the maximum vertical eye opening.

It will be appreciated that the maximum vertical eye opening phase can be calculated by knowing the position of the bit transition, the position of maximum value, and the bit length, where $\Delta\phi=0$ corresponds to the mid-bit position.

In the embodiment of FIG. 9, the amplitude detector circuit 302 analyses the eye after m bits with n sampling points.

Figure 10:
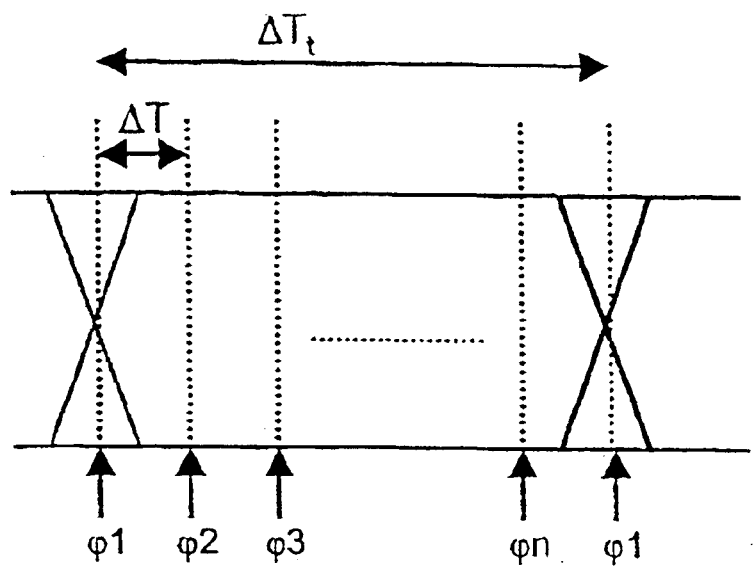
FIG. 10 is an eye diagram of an analog input data signal illustrating the relationship between the different clock phases and eye samples of the circuit of FIG. 9.

FIG. 10 illustrates the relation between the different clock phases and the eye samples in the circuit of FIG. 9. The total time difference $\Delta T_t$ for sampling the whole eye with n sampling points fulfills the following equations:

$$\Delta T_t = n^* \Delta T, \text{ and}$$

$$\Delta T = m^* 1/f_{clock},$$

where m and n are integers.

Figure 11:
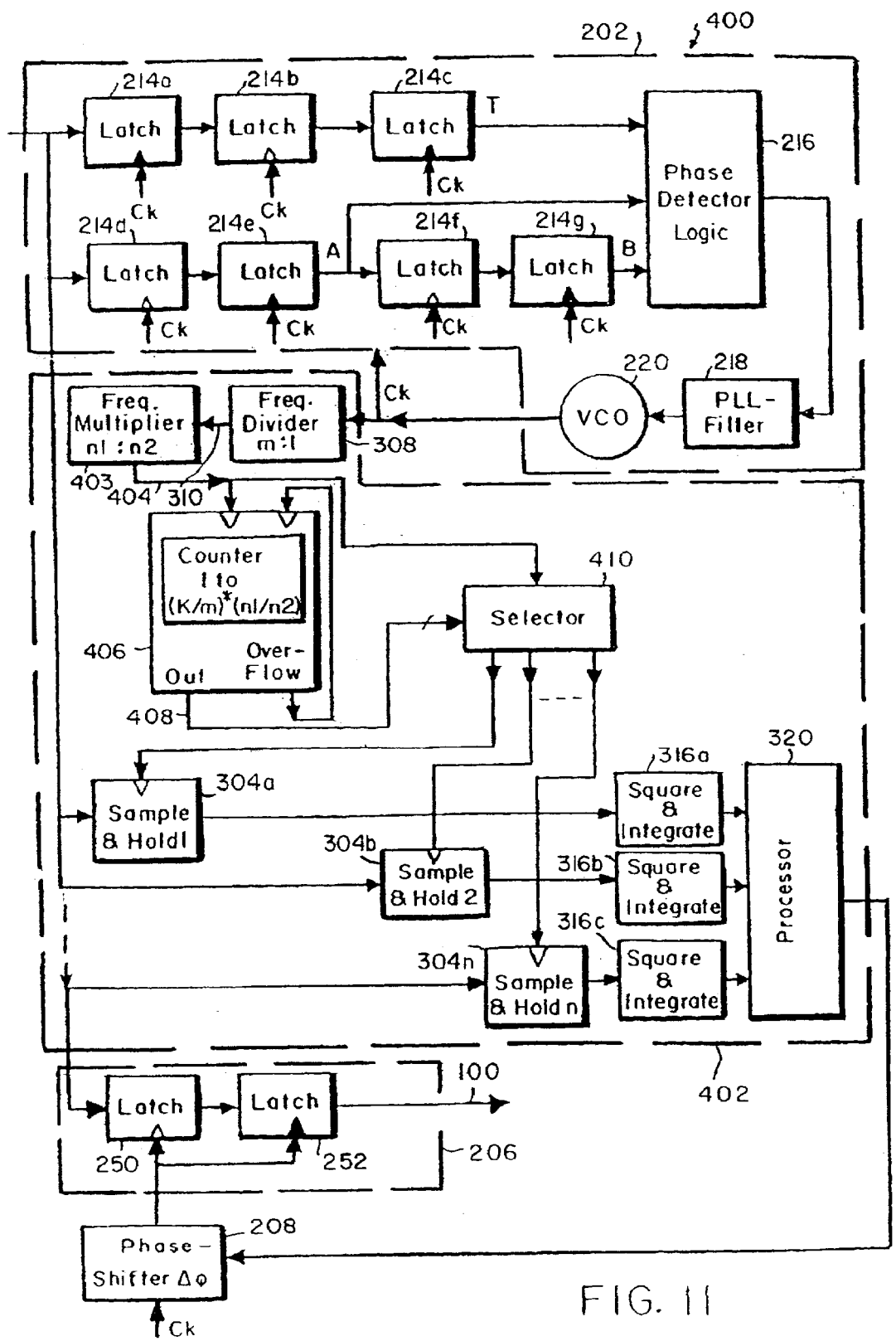
FIG. 11 is a detailed schematic diagram of a third embodiment of a circuit according to the present invention.

FIG. 11 illustrates an alternate implementation of the circuit of FIG. 9. Again like numerals are utilized to indicate like structure, the primary difference being the use of a frequency multiplier and counter in the amplitude detector.

The data recovery circuit 400 includes a clock recovery circuit 202, a master-slave D-type flip-flop 206, and a phase shifter circuit 208, all the same as described hereinbefore with respect to the circuits of FIGS. 8 and 9.

However, in this embodiment, the different clock phases are generated by multiplying the m-divided clock signal by the factor $n_1/n_2$, where $n_1$ and $n_2$ are integers. With reference to the Figure, an amplitude detector 402 includes a frequency divider circuit 308. In this embodiment the recovered clock signal $C_k$ from the clock recovery circuit 202 is supplied not only to the latches 214a–214g, but also to the frequency divider circuit 308, where the recovered clock signal is divided by an integer m to generate a trigger signal 310. The trigger signal 310 is supplied to a frequency multiplier circuit 403, which generates an output signal 404. The output signal 404 from the frequency multiplier circuit 403 is then input as a clock input to a counter 406. The counter 406 counts from 1 to $(k/m)^*(n_1/n_2)$, with k>m, where k is an integer, and generates different clock phase signals 408. An overflow signal 411 is fed back as a second input to counter 406. A selector block 410 selects the different clock phase signals 408 from the counter 406.

Figure 12:
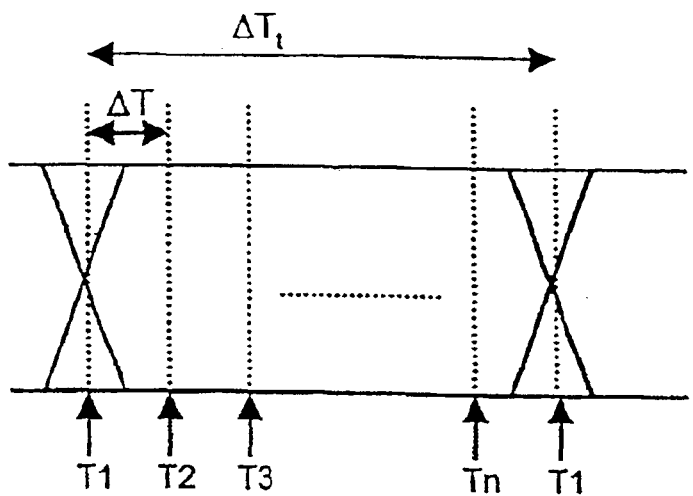
FIG. 12 is an eye diagram of an analog input data signal illustrating the relationship between the different clock phases and eye samples of the circuit of FIG. 11.

Reference is now made to FIG. 12, which illustrates the different clock phase signals 408. The timing difference between two phases $\Delta T$ is:

$$\Delta T = 1/f_{counter} = m^*n_2/n_1 * 1/f_{clock}$$

because the timing difference is determined by the output signal 404. The total time difference for sampling the whole eye with n sampling point fulfills the following equations:

$$\Delta T_t = n^* \Delta T$$

$$\Delta T_t = k^* 1/f_{clock},$$

This leads to the number n of parallel sample and hold paths, which satisfy the equations:

$$n = (k/m)^*(n_1/n_2) \text{ where n is an integer.}$$

The eye is sampled after $\Delta T_t$ with $$\Delta T_t = n^* m^* (n_2/n_1) * 1/f_{clock}.$$

Selector block 410 also receives counter signal 410 and provides outputs to each of a plurality of sample and hold circuits 304a–304n.

The amplitude detector circuit 412 includes a plurality n of the squaring and integrating circuits 316a–316n, coupled, respectively, to the plurality n of the sample and hold circuits 304a–304n. The squaring and integrating circuits 316a–316n are coupled to the n-channel parallel processor circuit 320, and operate as hereinbefore described with regard to FIG. 9.

Figure 13:
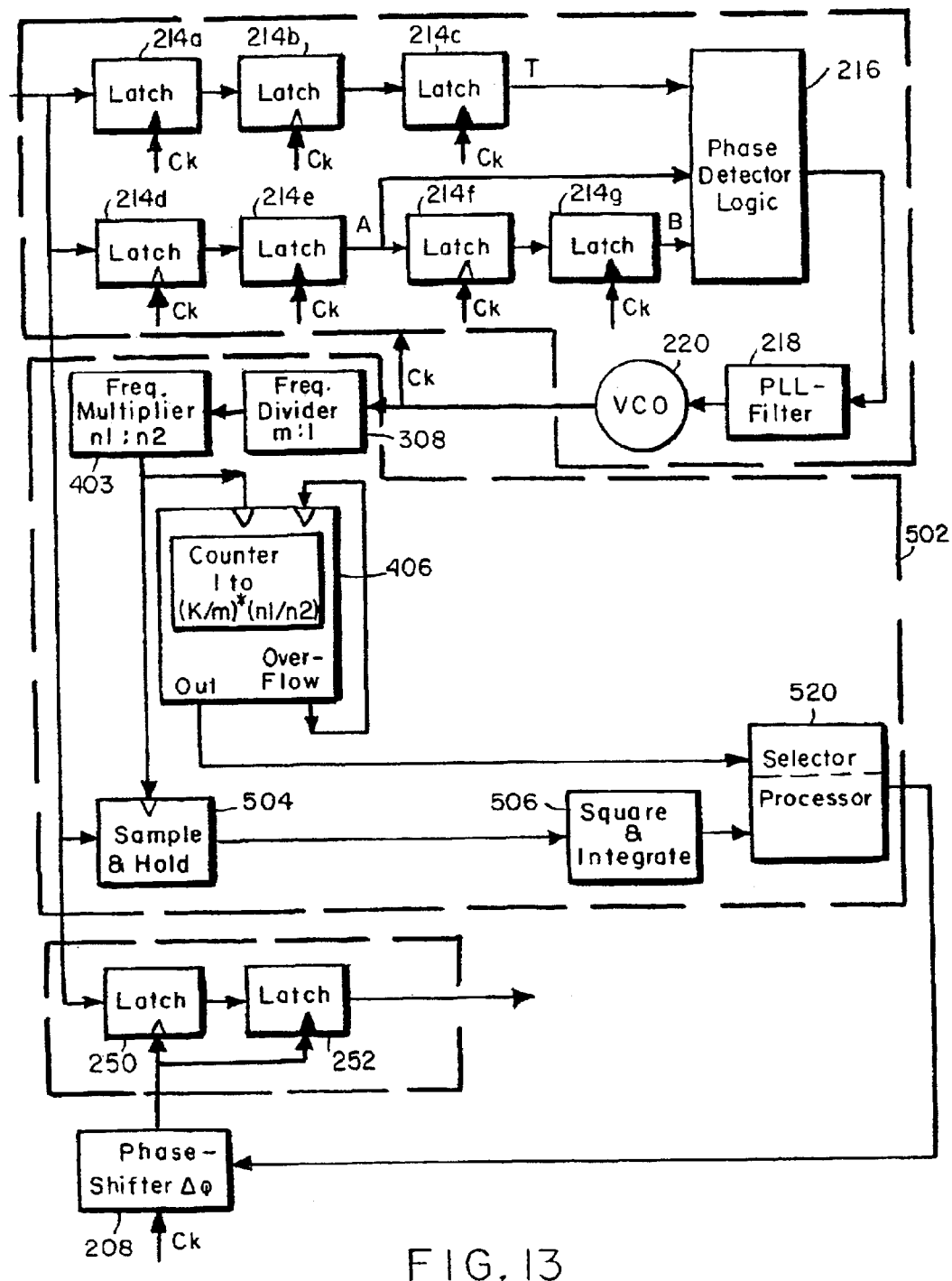
FIG. 13 is a detailed schematic diagram of a fourth embodiment of a circuit according to the present invention.

Reference is now made to FIG. 13 which depicts a another embodiment of the data recovery circuit of FIG. 11. Again, like numerals are used to indicate like structure. In the data recovery circuit 500 of the figure in which a serial configuration is used by way of example, circuit 500 includes the clock recovery circuit 202, the master-slave D-type flip-flop 206, and the phase shifter circuit 208 which all operate as hereinbefore described with respect to the data recovery circuit 400. In this implementation, however, an amplitude detector circuit 502 has only a single sample and hold circuit 504 and a single squaring and integrating circuit 506 coupled to a processor circuit 520. The sample and hold circuit 504 must operate at a frequency n times faster than a single one of sample and hold circuits 304a–304n of amplitude detector 400. The n-channel parallel processor circuit 520 must process serial data, so the input (I) ports must operate n times faster than the n-channel parallel processor circuit 320 of amplitude detector 402. It is to be appreciated that processor 520 now internally compares the derent sampling instants of amplitudes.

Various further modifications may be made to the invention disclosed herein. For example, the squaring and integrating circuits 316a–316n, 506 could generate the absolute value of the signal supplied thereto instead of squaring the value. Further, it is not necessary that the clock recovery and amplitude detector circuits be separate. This is only one possible solution. The amplitude sample of the analog input data signal 10 by the clock recovery circuit could also be taken as the recovered data, resulting in interweaved clock and data recovery. Still further, different implementations of the clock recovery circuit 202 could be used rather than the Alexander phase detector circuit disclosed herein.

It will be appreciated from the foregoing that a circuit in accord with applicants' invention offers significant advantages over prior art circuits. Applicants' circuit allows an increase in receiver performance and sensitivity with respect to heavily distorted data signals. This gives rise to at least the following advantages:

- an increase in the transmission span of a fiber-optical transmission system,
- relaxed requirements regarding the optical fiber itself e.g., losses and dispersion compensation,
- relaxed requirements regarding the receiver, e.g., lower photo-diode response, lower electrical amplification, lower clock phase margin, and
- a reduction in optical amplification.

Further, a circuit in accord with applicants' invention may be advantageously used in a 40 Gb/s per channel high-speed fiber-optic communication system.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A circuit for generating a digital data signal from an analog input data signal comprising:
   a) master-slave flip-flop receiving said analog input data signal;
   b) an amplitude detecting circuit for detecting the amplitude of said analog input data signal, said analog input data signal including a clock signal, and generating an amplitude detection signal in response thereto said amplitude detecting circuit including a sample and hold circuit for receiving said analog input data signal, a frequency divider circuit for dividing said recovered clock signal by a predetermined amount and supplying a divided clock signal to said sample and hold circuit, and a squaring and integrating circuit coupled to said sample and hold circuit;
   c) a phase shifting circuit responsive to said amplitude detection signal for supplying a phase shifted clock signal as a clock input to said master-slave flip flop;
   a clock recovery circuit receiving said analog input data signal and generating a recovered clock signal from said clock signal in said analog input data signal;
   said amplitude detecting circuit including a sample and hold circuit for receiving said analog input data signal; a frequency divider circuit for dividing said recovered clock signal by a predetermined amount and supplying a divided clock signal to said sample and hold circuit, and a squaring and integrating circuit coupled to said sample and hold circuit.

2. A circuit for generating a digital data signal from an analog input data signal having a maximum vertical eye opening and an input clock signal, comprising:
   a) a master-slave flip-flop receiving said analog input data signal;
   b) an amplitude detecting circuit for detecting said maximum vertical eye opening of said analog input data signal and generating a maximum vertical eye opening signal in response thereto; said amplitude detecting circuit including a sample and hold circuit for receiving said analog input data signal, a frequency divider circuit for dividing said recovered clock signal by a preset amount and supplying a divided clock signal to said sample and hold circuit, and a squaring and integrating circuit coupled to said sample and hold circuit;
   c) a clock recovery circuit for generating a recovered clock signal from said input clock signal; and
   d) a phase shifting circuit responsive to said maximum vertical eye opening signal and said recovered clock signal for supplying a phase shifted clock signal as a clock input to said master-slave flip-flop;
   said amplitude detecting circuit including a sample and hold circuit for receiving said analog input data signal, a frequency divider circuit for dividing said recovered clock signal by a preset amount and supplying a divided clock signal to said sample and hold circuit, and a squaring and integrating circuit coupled to said sample and hold circuit.

3. The circuit of claim 2, wherein said amplitude detecting circuit includes a signal processing circuit coupled to said squaring and integrating circuit for calculating said amplitude detection signal supplied to said phase shifting circuit.

4. A circuit for generating a digital data signal from an analog input data signal having a maximum vertical eye opening and an input clock signal, comprising:
   a) a master-slave flip-flop receiving said analog input data signal;
   b) an amplitude detecting circuit for detecting said maximum vertical eye opening and generating a maximum vertical eye opening signal in response thereto, wherein said amplitude detecting circuit includes a sample and hold circuit for receiving said analog input data signal, a squaring and integrating circuit coupled to said sample and hold circuit, a signal processing circuit coupled to said squaring and integrating circuit for calculating said amplitude detection signal supplied to said phase shifting circuit, a frequency divider circuit for dividing said recovered clock signal by a preset amount and supplying a divided clock signal to said sample and hold circuit, and a frequency multiplier circuit coupled to said frequency dividing circuit for multiplying said divided clock signal by a second preset amount to generate trigger signals;
   c) a clock recovery circuit for generating a recovered clock signal from said input clock signal; and
   d) a phase shifting circuit responsive to said maximum vertical eye opening signal and said recovered clock signal for supplying a phase shifted clock signal as a clock input to said master-slave flip-flop.

5. The circuit of claim 4, wherein said amplitude detecting circuit includes a counter coupled to said frequency multiplier circuit for generating a count signal in response to said trigger signals.

6. The circuit of claim 5, wherein said amplitude detecting circuit includes a selector circuit connecting said counter with said signal processing circuit.

7. The circuit of claim 5, wherein said amplituide detecting circuit includes at least a second sample and hold circuit, each responsive to said trigger signals and generating a sampled signal, and at least a second squaring and integrating circuit, each associated with a respective one of said sample and hold circuits; and further comprising a selector circuit coupled to said frequency multiplier circuit and said counter for selecting said sampled signals to be supplied to said respective squaring and integrating circuits.

8. A circuit for generating a digital data signal from an analog input data signal carried on a high-speed communications network, said analog input data signal having a maximum vertical eye opening and a clock signal, comprising:
   a) a D-type master-slave flip-flop for receiving said analog input data signal;
   b) an amplitude detecting circuit for detecting said maximum vertical eye opening of said analog input data signal and generating a maximum vertical eye opening signal in response thereto, said amplitude detecting circuit comprising:
      i) a sample and hold circuit for sampling said analog input data signal and outputting a sampled circuit in response to said analog input data;
      ii) a squaring and integrating circuit for outputting a squared and integrated signal in response to said analog input data signal;
      iii) a signal processing circuit for determining a maximum vertical eye opening value in response to said square and integrated signal; and
      iv) a frequency divider circuit outputting clock signal to said sample and hold circuit;
   c) a phase shifting circuit responsive to said maximum vertical eye opening signal for supplying a phase shift signal to said D-type master-slave flip-flop; and
   d) a clock recovery circuit for generating a recovered clock signal from said clock signal contained in said analog input data signal, said clock recovery circuit comprising:
      i) a plurality of latch circuits for generating a plurality of clock sample signals from said analog data input signal;
      ii) a phase detector logic circuit for generating a phase detected signal in response to said plurality of clock sample signals;
      iii) a phase-locked-loop filter for generating a control signal in response to said phase detected signal; and
      iv) a voltage controlled oscillator for actuating said plurality of latch circuits and said phase shifting circuit in response to said control signal.

9. The circuit of claim 8, wherein said amplitude detecting circuit includes at least a second sample and hold circuit, and at least a second phase shifting circuit coupled to said frequency divider circuit and said plurality of said sample and hold circuits.

10. A circuit for generating a digital data signal from an analog input data signal carried on a high-speed communications network, said analog input data signal having a maximum vertical eye opening and a clock signal, comprising:
   a) a D-type master-slave flip-flop for receiving said analog input data signal;
   b) an amplitude detecting circuit for detecting said maximum vertical eye opening of said analog input data signal and generating a maximum vertical eye opening signal in response thereto, said amplitude detecting circuit comprising:
      i) a sample and hold circuit for sampling said analog input data signal and outputting a sampled circuit in response to said analog input data;
      ii) a squaring and integrating circuit for outputting a squared and integrated signal in response to said analog input data signal;
      iii) a signal processing circuit for determining a maximum vertical eye opening value in response to said square and integrated signal;
      iv) a frequency divider circuit outputting clock signal to said sample and hold circuit; and
      v) a frequency multiplier circuit coupled to said frequency dividing circuit for generating trigger signals, and a counter coupled to said frequency multiplier circuit for generating a count signal in response to said trigger signals;
   c) a phase shifting circuit responsive to said maximum vertical eye opening signal for supplying a phase shift signal to said D-type master-slave flip-flop; and
   d) a clock recovery circuit for generating a recovered clock signal from said clock signal contained in said analog input data signal, said clock recovery circuit comprising:
      i) a plurality of latch circuits for generating a plurality of clock sample signals from said analog data input signal;
      ii) a phase detector logic circuit for generating a phase detected signal in response to said plurality of clock sample signals;
      iii) a phase-locked-loop filter for generating a control signal in response to said phase detected signal; and
      iv) a voltage controlled oscillator for actuating said plurality of latch circuits and said phase shifting circuit in response to said control signal.

11. The circuit of claim 10, wherein each of said sample and hold circuits, is responsive to said trigger signals and generating a plurality of sampled signals, and at least a second squaring and integrating circuit, each being associated with a respective one of said sample and hold circuits; and further comprising a selector circuit coupled to said frequency multiplier circuit and said counter for selecting said sampled signals to be supplied to said squaring and integrating circuits.

* * * * *